United States Patent [19]

Izadinia

[11] Patent Number: 5,084,633
[45] Date of Patent: Jan. 28, 1992

[54] BIDIRECTIONAL CURRENT SENSING FOR POWER MOSFETS

[75] Inventor: Mansour Izadinia, Santa Clara, Calif.

[73] Assignee: National Semiconductor Corporation, Santa Clara, Calif.

[21] Appl. No.: 600,040

[22] Filed: Oct. 19, 1990

[51] Int. Cl.[5] .................... H03K 17/16; H03K 19/094
[52] U.S. Cl. ..................................... 307/270; 307/570; 307/584; 307/350; 307/362
[58] Field of Search .................. 307/570–573, 307/584–585, 270, 350, 362

[56] References Cited

U.S. PATENT DOCUMENTS 4,454,454  6/1984  Valentine ........................... 307/270

Primary Examiner—Stanley D. Miller
Assistant Examiner—Margaret Rose Wambach
Attorney, Agent, or Firm—Gail W. Woodward; Irving S. Rappaport; James W. Rose

[57] ABSTRACT

A circuit capable of being integrated into a self-isolated DMOST is driven by a sense resistor that is created from the DMOST drain metallization. The circuit produces an output current that is ratioed with respect to the DMOST current with the ratio being determined by the value of a single resistor. The output current is sourced when the DMOST conducts its source current and the output current is sunk when the DMOST shunt diode conducts. Thus, the circuit not only produces a DMOST current related output it also distinguishes the mode of DMOST conduction.

7 Claims, 2 Drawing Sheets

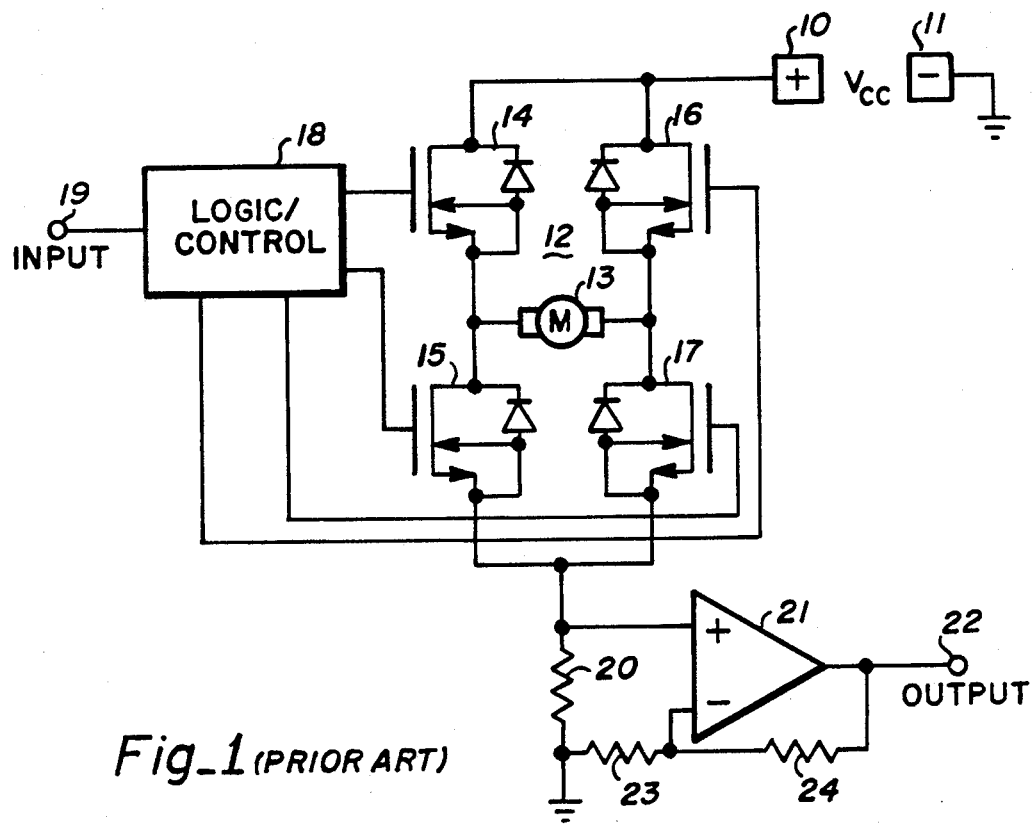
Fig_1 (PRIOR ART)
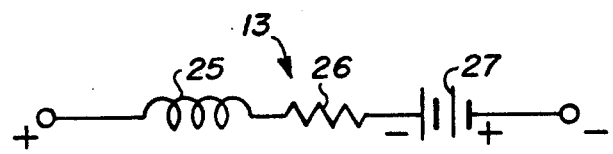
Fig_2 (PRIOR ART)

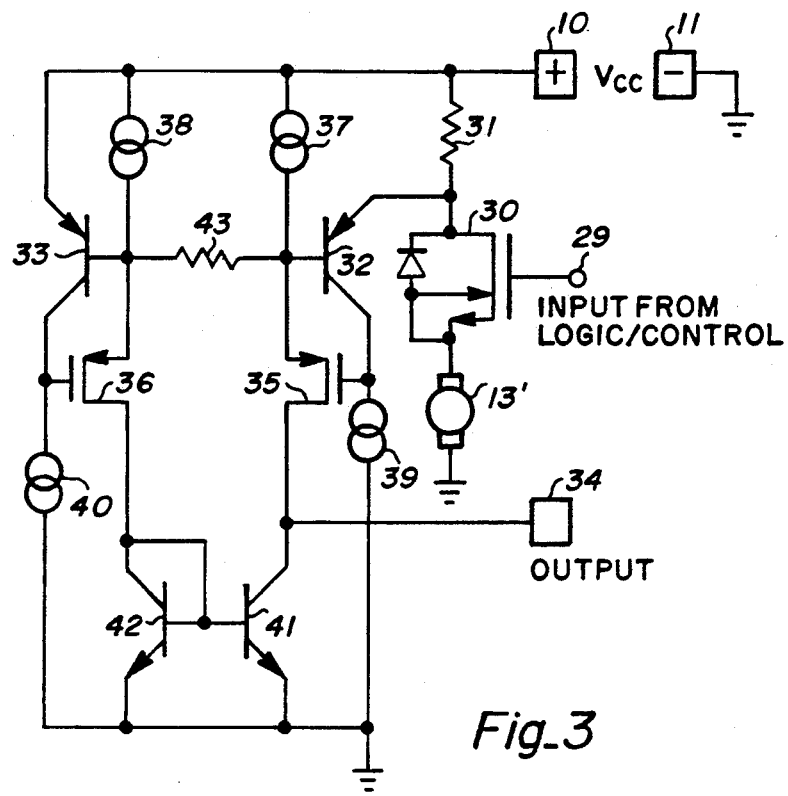
Fig_3
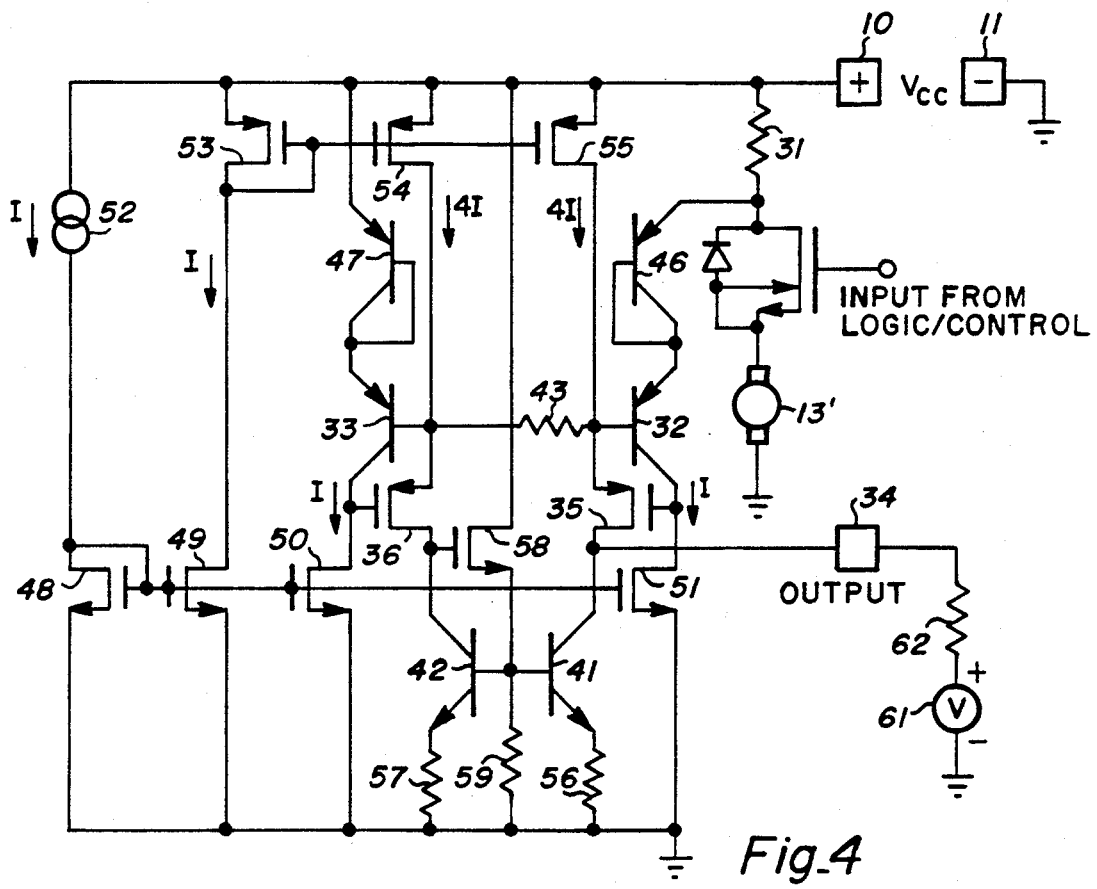
Fig_4

BIDIRECTIONAL CURRENT SENSING FOR POWER MOSFETS

BACKGROUND OF THE INVENTION

The invention relates to the use of Metal Oxide Semiconductor Field Effect Transistor (MOSFET) devices that are operated as switches. Such devices make excellent power switches for use in integrated circuit (IC) applications. Typically, a power MOSFET is created by fabricating a large number of small transistors into a silicon substrate and then connecting them in parallel by means of the aluminum IC metallization. By connecting several thousand such individual transistors in parallel the resulting power MOSFET can switch many amperes of current. The on resistance is a small fraction of an ohm. Such power MOSFET's can be self-isolated on an IC chip and combined with other elements using conventional bipolar junction transistor (BJT) processing and complementary metal oxide semiconductor (CMOS) fabrication to provide the circuits that operate and control the power MOSFET's in the development of so-called "smart switches".

In a copending patent application, titled CURRENT SENSING OF A DC OR A STEPPER MOTOR, Ser. No. 314,334, filed Feb. 23, 1989, now U.S. Pat. No. 5,032,745 issued July 16, 1991, a circuit is described for sensing the current flowing in a power DMOST (Diffused Metal Oxide Semiconductor Transistor), which is a form of MOSFET. The DMOST disclosed is constructed with a separate current sense emitter which provides a sense current that represents a fraction of the power DMOST current. This application is assigned to the assignee of the present invention and its teaching is incorporated herein by reference.

The aforementioned patent application also teaches what is known as an "H switch" configuration. Here, four power DMOST's are coupled together so that each of the four vertical H legs are composed of power switches and the horizontal bar represents the load being switched. Diagonally opposed DMOST's are turned off and on together by the control circuitry so that current can be passed through the load in either direction. The load current can be controlled by means of the duty cycle of the pulses used to switch the DMOST's.

The conventional DMOST incorporates a shunt diode that can act as a current snubber which makes the device conductive in both directions. When the DMOST is turned on it will conduct current between its drain and source elements and has a relatively low voltage drop. In the reverse polarity the shunt diode will conduct and, thus, produce the well-known $V_{BE}$ voltage drop. This means that the DMOST will conduct bilaterally and produce small voltage drops in both directions.

In the prior art smart switches the current sensing provides an output that represents the DMOST conduction. Where an H switch is involved the total current flow is sensed. It would be desirable to be able to sense the DMOST on current independently from the total current in order to better control the digital switching of the devices.

SUMMARY OF THE INVENTION

It is an object of the invention to provide a circuit that produces an output that represents the on current of a DMOST power switch.

It is a further object of the invention to provide a circuit associated with a DMOST that will produce an output that indicates the DMOST forward conduction and its reverse conduction separately.

It is a still further object of the invention to provide an IC that contains a power DMOST along with associated circuitry that provides an output which is related separately to the forward DMOST conduction and to the reverse or shunt diode conduction.

These and other objects are achieved as follows. A power DMOST is constructed in a silicon substrate using conventional planar processing and the associated metallization is configured to provide a low value sense resistor in the DMOST drain. The voltage developed across this resistor has a magnitude that is proportional to the DMOST conduction and a polarity that represents the mode of conduction. One polarity represents the DMOST conduction as a MOSFET and the other polarity represents the shunt diode conduction. The sense resistor is coupled to the input of a differential amplifier (diff-amp) the output of which is related in magnitude and polarity to the DMOST forward conduction and its shunt diode reverse conduction. The diff-amp incorporates a conventional bipolar transistor pair input stage that is emitter driven and includes a body resistor coupled between the transistor pair bases. This body resistor is ratioed with respect to the sense resistor and thereby passes a current that is a controlled fraction of the DMOST current. Thus, the diff-amp input voltage is equal to the sense resistor voltage and its input impedance is large with respect to the sense resistance.

The diff-amp includes an output node that will source current in proportion to the DMOST forward or on current. It will sink current in proportion to the DMOST shunt diode conduction. Thus, the circuit will not only provide a current sense, it also provides an indication of the current direction.

BRIEF DESCRIPTION OF THE DRAWING

FIG. 1 is a schematic-block diagram of a typical prior art H switch current sensing circuit.

FIG. 2 is a schematic diagram of a typical load element.

FIG. 3 is a simplified schematic diagram of the circuit of the invention.

FIG. 4 is a detailed schematic diagram of the preferred embodiment of the invention.

DESCRIPTION OF THE PRIOR ART

FIG. 1 shows a prior art H switch motor driver circuit 12 with current sensing. The circuit operates with a $V_{CC}$ power supply connected + to terminal 10 and − to ground terminal 11 A motor 13 is driven as the horizontal H leg by means of four diffused metal oxide semiconductor transistors (DMOST's) 14–17. These transistors form the four vertical legs of the H. The DMOST devices shown are N-channel transistors and each one has an associated built-in diode. The back gates are returned to the respective sources. Such a DMOST is well known in the art and typical devices can switch large currents (typically ten amperes) and their internal resistance is quite low (for example, 0.3 ohms). Thus, the power dissipation when conducting is low. When switched off the leakage current is quite low and a typical device can withstand several hundred volts. For an N-channel DMOST the drain is positively biased so that their forward conduction is by way of electrons flowing internally from source to drain. Making the gate sufficiently negative with respect to the source can repel virtually all of the electrons out of the channel thus turning the device off. When the gate is positive with respect to the source, electrons are attracted into the channel and the device conducts.

It will be noted that the DMOST includes a diode in shunt with the source and drain electrodes. Under normal drain bias this diode is reverse biased and only a small leakage current flows therein. However, when the drain is biased negatively with respect to the source, the shunt diode is forward biased. In this direction, where the diode conducts, the voltage drop is about 0.7 volts at one ampere. Thus, the DMOST will conduct bilaterally with a low voltage drop in the positive drain polarity and a single diode drop in the negative drain polarity.

As shown in FIG. 1, DMOST's 14–17 are gate driven by a logic/control unit 18 which responds to a control input at 19. The bottom end of the H switch is returned to ground by way of a low value resistor 20. Thus, any current flowing in the H switch must flow through resistor 20 thereby to develop a small voltage drop. For example, if resistor 20 is on the order of 0.01 ohm, a ten amp switch current will develop a 100 millivolt drop across resistor 20. Op amp 21 responds to the voltage across resistor 20 and produces an output voltage at terminal 22 which is related to the H switch current. Resistors 23 and 24 form a negative feedback loop around op-amp 21 and their value will determine the voltage gain thereof. For example, if resistor 23 is ratioed with respect to resistor 24 to provide an op-amp gain of 100, the output at terminal 22 will approximate an output of one volt for each amp of H switch current (assuming a 0.01 ohm value for resistor 20).

Typically, control/logic unit 18 will operate DMOST's 14–17 as switches, it will provide current control by means of the duty cycle. For example, if DMOST's 14 and 17 are pulsed on while DMOST's 15 and 16 are held off, it can be seen that current will flow from left to right in motor 13. To reverse the motor DMOST's 15 and 16 will be pulsed on while DMOST's 14 and 17 are held off. If al four DMOST's are off no current will flow. Finally, if 14 and 16 or 15 and 17 are turned on the motor will not turn, but heavy dynamic breaking is present. The braking is proportional to the on conduction duty cycle. This mode of operation can be employed to rapidly halt the motor rotation after it has been operating at some speed.

As shown in FIG. 2, motor 13 includes components of inductance 25, resistance 26 and back electromotive force (e.m.f 27. When the motor is rotated due to the drive polarity shown where DMOST's 14 and 17 are on, the back e.m.f. shown opposes the drive. In operation control/logic unit 18 operates the motor by pulsing it at a duration that is very short with respect to the motor time constant. Accordingly, when the DMOST's are switched on the current flowing in the motor will rise linearly as a function of the L/R time consant. Then, when the DMOST's are turned off the motor back e.m.f. will turn the opposing H switch diodes on and the motor current will fall linearly with time. Again, the fall will be a function of the L/R time constant. The motor current average is a function of the pulse duty cycle. For a very low duty cycle, the DMOST's are off most of the time and only a small average current will flow in the motor. When a large duty cycle is employed a large average motor current will flow. Thus, a simple pulse width control will determine motor speed.

If desired, op-amp 21 can be made to integrate the voltage across resistor 20 by connecting a capacitor (not shown) across resistor 24. Alternatively, an integrator can be inserted into the circuit between resistor 20 and op-amp 21. In this case, the output at terminal 22 will be related to the average H switch current. This average can only change as rapidly as the integrator time constant will allow.

It would be desirable if the current flowing in a DMOST could be related directly and instantaneously to the current flowing therein. Then, the operation of the control/logic function could be more appropriately and rapidly operated.

SUMMARY OF THE INVENTION

FIG. 3 is a simplified schematic diagram of the circuit of the invention. The circuit operates from a $V_{CC}$ power supply connected + to terminal 10 and − to ground terminal 11. It is to be understood that the circuit could be employed with any or all of the DMOST's in an H switch, for example, elements 14–17 of FIG. 1.

The heart of the circuit is DMOST 30, which is shown as an N channel device. Resistor 31 is a low value current sensing element which is preferably composed of the drain metallization of DMOST 30. In the fabrication of DMOST 30 the drain metal is photolithographically contoured to produce a controlled resistance value. For example, it can be made to produce a value of twenty milliohms. Since all of the drain current of DMOST 30 passes through resistor 31 it will develop a voltage that is directly proportional to the current. For example, when fifteen amperes flow the voltage drop across resistor 31 will be 300 millivolts. This voltage will be insignificant with respect to the $V_{CC}$ supply, but will be sufficient to operate the current sensing circuit. It should also be noted that when DMOST 30 conducts its drain potential will be below $V_{CC}$. However, when DMOST 30 is turned off, and the associated diode conducts, its drain potential will be above $V_{CC}$. This means that when the diode conducts the sense voltage is reversed with respect to the polarity produced when DMOST 30 is conducting. Thus, the circuit distinguishes between transistor and diode conduction.

Transistors 32 and 33 form the differential input stage of an op-amp, the output of which appears at terminal 34. Transistor 32 comprises the inverting input and transistor 33 comprises the noninverting input. They are differentially emitter driven from the potential across resistor 31.

P channel FET 35 is coupled between the base and collector of transistor 32 which is thereby forced to act as a diode due to the source follower action of transistor 35. Likewise, P channel FET 36 forces transistor 33 to function as a diode. The sources of FET's 35 and 36 are returned respectively to the $+V_{CC}$ supply line by constant current sources 37 and 38. The collectors of transistors 32 and 33 are respectively returned to ground by way of constant current sinks 39 and 40.

The drains of FET's 35 and 36 are connected to a current mirror that acts as the output load for the op-amp. It provides the necessary differential to single-ended output action. This output current mirror is composed of transistors 41 and 42 and the single-ended output is available at terminal 34.

Resistor 43, which is coupled between the bases of input transistors 32 and 33, is ratioed with respect to the value of resistor 31. The value of resistor 43 determines the circuit sensitivity in the following manner. In the preferred embodiment of the invention resistor 43 is made to have 500 ohms. This is 25,000 times the value of resistor 31. It can be seen that the right-hand end of resistor 43 is one diode drop plus the potential across resistor 31 below $V_{CC}$. The left-hand end of resistor 43 is one diode drop below $V_{CC}$. If transistors 32 and 33 are matched and current sinks 39 and 40 are matched, the diode drops are equal so that the potential across resistor 43 equals that across resistor 31. However, since resistor 43 is larger than resistor 31, the current in resistor 43 is scaled down. For the ratio mentioned in the preferred embodiment, a DMOST 30 current of 10 amperes will produce 400 microamperes in resistor 43. This will offset the currents in FET's 35 and 36 by 800 microampere. If 37 and 38 were to be made 600 microamperes each, this will force the current in 42 and 36 to be 200 microamperes, while the current in 35 is 1 milliampere. Since 41 and 42 form a current mirror, 41 will carry 200 microamperes. Thus, the current in the output lead 34 is the difference between currents in 35 and 41 which is 800 microamperes. Therefore it can be seen that the circuit current sensitivity is $$\frac{2^{I}LOAD}{\frac{R_{43}}{R_{31}}} = \frac{2R_{31}(^{I}LOAD)}{R_{43}}$$

The output terminal will source the current when the emitter of transistor 32 is lower in potential than the emitter of transistor 33. Thus, the output current sourced is related to the DMOST 30 conduction. Conversely, when DMOST 30 is turned off, and the associated diode conducts, the current flow in resistors 31 and 43 will be reversed and output terminal 34 will sink current at the above-detailed ratio. Therefore, not only does the circuit produce an output directly related to the conduction of DMOST 30, it also produces an opposite polarity related to the associated diode conduction. These outputs can be employed to more effectively control the operation of the switching of the logic/control circuits.

FIG. 4 is a schematic diagram of the preferred embodiment of the invention. Where the parts duplicate those of FIG. 3 the same numerals are used. The differences relate to the inclusion of a pair of diode-connected transistors 46 and 47, respectively coupled in series with the emitters of transistors 32 and 33 and the use of CMOS constant current circuitry.

The constant current circuit employs a pair of current mirrors each one having a pair of matched current outputs. This functions to provide elements 37-40 of FIG. 3.

Matched N channel transistors 48-51 form the first current mirror. Transistor 48, which has its gate returned to its drain, receives an input current, I, from source 52. Since the gates of transistors 49-51 are all coupled to the gate of transistor their conduction will also be equal to I. Transistors 50 and 51 serve the function of sinks 40 and 39 of FIG. 3.

Transistors 53-55 form the second current mirror. Transistor 53, which has its gate returned to its drain, conducts I to transistor 49. Transistors 54 and 55, which have their gates coupled to the gate of transistor 53, therefore act as current sources to supply transistors 36 and 35 with constant currents. Thus, these current sources provide the function of sources 38 and 37 of FIG. 3. In the preferred embodiment of the invention, tansistors 54 and 55 are matched and have four times the width of transistor 53 so that 4I flows into each of transistors 36 and 35. The preferred embodiment employed a 150 microampere source at element 52 so that the two current sources each passed 600 microamperes.

The current mirror load matched transistors 41 and 42 respectively include matched resistors 56 and 57 in series with their emitters. The base currents in transistors 41 and 42 are supplied with source follower N channel transistor 58. Resistor 59 acts as the source load element for transistor 58. Transistor 58 couples the collector of transistor 42 to its base thus creating a super-diode current mirror. Since transistor 42 is forced to function as a diode, for the current load input function, a highly accurate current mirror is provided.

One additional feature is shown in FIG. 4. External IC components are shown as a constant voltage supply 61 and series resistor 62. If the user of the IC desires, the zero DMOST current condition can provide a clamped output voltage. Typically, constant voltage source 61 will be a temperature compensated supply having a relatively low internal impedance. Resistor can then be selected to provide a predetermined DMOST current to output voltage relationship. For example, since the preferred embodiment produced an output current of 800 microampere for a 10 ampere DMOST current, a value of resistor 62, that when added to the internal resistance of source 61, will provide a 7.5 k ohm value, the output voltage will vary at a rate of 0.6 volts per DMOST ampere.

The following component values were employed in the preferred embodiment.

| COMPONENT | VALUE |
|---|---|
| Resistor 31 | 20 milliohms |
| Resistor 43 | 500 ohms |
| Transistors 48-51 and 58 | 37/2 (W/L) microns |
| Current Source 52 | 150 microampere |
| Transistor 53 | 75/5 (W/L) microns |
| Transistors 35-36 | 115/10 (W/L) microns |
| Transistors 54-55 | 300/5 (W/L) microns |
| Resistors 56-57 | 1k ohms |
| Resistor 59 | 50k ohms |

The circuit was designed to operate with a supply $V_{CC}$ of 60 volts maximum. The output current at terminal 34 was 80 microamperes per DMOST ampere.

The invention has been described and a preferred embodiment detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A circuit for use with a diffused metal oxide semiconductor transistor (DMOST) having a drain, a source, a gate, a backgate connected to the source and a shunt diode connected between the drain and the source wherein said gate controls the conduction between the source and drain, said circuit functioning to produce an output related to the currents flowing in said DMOST source and shunt diode and comprising:

a relatively low value sense resistor connected in series with said DMOST drain;
  a differential input stage coupled to said sense resistor and including input stage bipolar junction transistors, each input stage bipolar junction transistor having a base, a collector and an emitter;
  a current mirror load coupled to said input stage to provide a single-ended output that is related to said current in said sense resistor.

2. The circuit of claim 1 wherein said sense resistor comprises the metallization employed to create said DMOST.

3. The circuit of claim 1 wherein said sense resistor is coupled to the emitters of said input stage transistors and a second resistor is coupled between the bases thereof.

4. The circuit of claim 1 wherein said second resistor is ratioed in value to said sense resistor whereby said voltage that appears across said sense resistor also appears across said second resistor and a current flows in said second resistor in inverse proportion to said ratio.

5. The circuit of claim 4 wherein said input stage further comprises a pair of metal oxide semiconductor field effect transistors (MOSFET's) having their gates connected to said input stage transistor collectors and their sources connected to said input stage transistor bases whereby said MOSFET's source follower action forces said input stage transistors to function as diodes.

6. The circuit of claim 5 further comprising a first pair of constant current elements coupled to source current into said pair of MOSFET's.

7. The circuit of claim 6 further comprising a second pair of constant current elements coupled to sink current from the collectors of said input stage transistors whereby said current mirror load produces an output current proportional to said current in said second resistor.

* * * * *